Dec. 8, 1970 H. HARGASSER ET AL 3,546,616

DC COUPLED MULTISTAGE AMPLIFIER HAVING CONTROLLABLE AMPLIFICATION

Filed June 30, 1969

United States Patent Office
3,546,616
Patented Dec. 8, 1970

3,546,616

DC COUPLED MULTISTAGE AMPLIFIER HAVING CONTROLLABLE AMPLIFICATION

Hans Hargasser, Eckart Schatter, and Ulrich Renk, Munich, Germany, assignors to Siemens Aktiengesellschaft, Munich, Germany, a corporation of Germany Filed June 30, 1969, Ser. No. 837,614
Claims priority, application Germany, July 8, 1968, 1,762,561
Int. Cl. H03g 3/30
U.S. Cl. 330—29 3 Claims

ABSTRACT OF THE DISCLOSURE

A feedback circuit coupling the output of the additional amplifier stages to the input of a first amplifier stage regulates the working point of the first stage. The amplification of the additional stages is independent of the working point regulation. A control circuit connected to the operational voltage branch of the first stage applies a control voltage to the first stage to vary the operational voltage thereof.

DECRIPTION OF THE INVENTION

The present invention relates to a DC coupled multistage amplifier. More particularly, the invention relates to a DC coupled multistage amplifier having controllable amplification.

The amplification of the multistage amplifier is regulated by variation of the working or operation point of one or more first amplifier stages. One or more additional amplifier stages are connected to the output of the first amplifier stages. A feedback circuit coupling the output of the additional amplifier stages to the input of the first amplifier stages regulates the working point of the first amplifier stages under the control of the additional amplifier stages. The amplification of the additional amplifier stages is substantially independent of the regulation of the working point of the first amplifier stages.

In known multistage controlled amplifiers, the amplification of one or more stages is regulated by variation of the working or operation point. The essential feature is the fact that the coupling of the individual amplifier stages disconnects or separates the direct current. When amplifiers having controllable amplification are to be manufactured as integrated units, the decoupling of the DC of the individual amplifier stages results in integrated circuits which require relatively extensive outside circuitry. Multistage amplifiers of this type, having controllable amplification are unsuitable for an integrated unit design.

The requirements and conditions are considerably simpler when DC coupling is utilized for coupling the individual amplifier stages to each other.

The principal object of the present invention is to provide a new and improved DC coupled multistage amplifier having controllable amplification.

An object of the present invention is to provide a DC coupled multistage amplifier having controllable amplification which overcomes the disadvantages of known amplifiers having controllable amplification.

An object of the present invention is to provide a DC coupled multistage amplifier in which the first amplifier stages are controlled in amplification.

An object of the present invention is to provide a DC coupled multistage amplifier having controllable amplification which is ready and suitable for manufacture as an integrated unit.

An object of the present invention is to provide a DC coupled multistage amplifier having controllable amplification which functions with efficiency, effectiveness and reliability.

The objective of the present invention is to provide a DC coupled multistage amplifier in which the amplification is controlled by regulation of the amplification of the first amplifier stages.

In accordance with the present invention, the objective is attained by varying the operational voltage of the first amplifier stage or stages in accordance with a control voltage.

In accordance with the present invention, a DC coupled multistage amplifier is controllable in amplification and has a first amplifier stage or stages having an input, an operational voltage branch and an output, and an additional amplifier stage or stages having an input connected to the output of the first amplifier stage and an output of the additional amplifier stage to the input of the first amplifier stage for regulating the working point of the first amplifier stage under the control of the additional amplifier stage. The amplification of the additional amplifier stage is substantially independent of the regulation of the working point of the first amplifier stage. A control circuit connected to the operational voltage branch of the first amplifier stage applies a control voltage to the first amplifier stage to vary the operational voltage of the first amplifier stage.

The control circuit comprises a control transistor connected to the operational voltage branch of the first amplifier stage. The control voltage is applied to the transistor to trigger the transistor to vary the operational voltage of the first amplifier stage in accordance with the control voltage.

The control circuit further comprises an auxiliary control transistor having an input electrode and an output electrode coupled to the input electrode of the control transistor of the control circuit. The control voltage is applied to the auxiliary control transistor to trigger such transistor. A diode circuit couples the output electrode of the auxiliary control transistor to the input electrode of the control transistor. The auxiliary control transistor provides at its output electrode a voltage having a predetermined final magnitude dependent upon the control condition of the transistor when the amplification of the first amplifier stage is under control.

A current conducting resistor is connected in parallel with the emitter-collector path of the control transistor for determining a minimum amplification of the first amplifier stage at full control.

The amplifier is an integrated monolithic circuit.

In order that the present invention may be readily carried into effect, it will now be described with reference to the accompanying drawing, wherein.

In the figures, the same components are identified by the same reference numerals.

Figure 1:
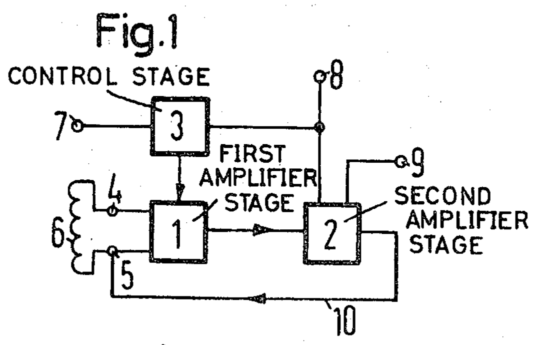
FIG. 1 is a block diagram of an embodiment of the DC coupled multistage amplifier of the present invention.

In FIG. 1, a first amplifier stage 1 may comprise one or more amplifier stages and a second amplifier stage 2 may comprise one or more amplifier stages. The second amplifier stage 2 has an input connected to the output of the first amplifier stage 1. An input signal to be amplified is supplied to the first amplifier stage 1 via any suitable input means such as, for example, a coupling inductance 6 which is connected to input terminals 4 and 5 of said first amplifier stage.

The amplified output signal is provided at an output terminal 9 of the second amplifier stage. A feedback circuit 10 is connected from the output of the second amplifier stage 2 to the input terminal 5 of the first amplifier stage 1. The feedback circuit 10 regulates the working or operation point of the first amplifier stage 1 under the control of the additional amplifier stage 2. The feedback circuit 10 is shown in greater detail in FIG. 2.

In accordance with the present invention, the operational voltage of the first amplifier stage 1 is varied in order to control the amplification of the multistage amplifier. The operational voltage is applied to the second amplifier stage 2 via an input terminal 8. The operational voltage of the second amplifier stage 2 thus remains constant. A control voltage is applied to the first amplifier stage 1 to vary the operational voltage of said first amplifier stage. A control circuit 3 is connected to the operational voltage branch of the first amplifier stage 1 and provides the control voltage of the first amplifier stage. The control voltage is applied to the control circuit via an input terminal 7 thereof. The control circuit 3 thus controls the operational voltage, and therefore the amplification, of the first amplifier stage 1.

Figure 2:
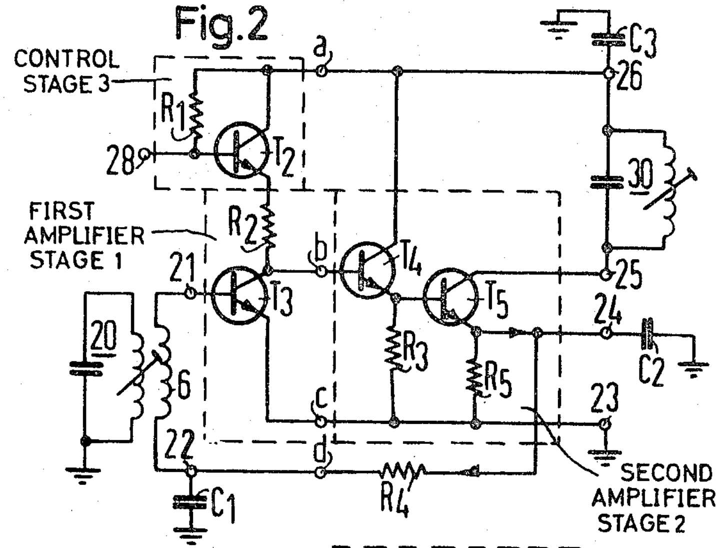
FIG. 2 is a circuit diagram of the embodiment of FIG. 1.

In FIG. 2, the first amplifier stage 1 comprises a transistor $T_3$. An operating resistor $R_2$ is connected to the collector electrode of the transistor $T_3$. The output terminals *b* and *c* of the first amplifier stage 1 are connected to the input terminals of the second amplifier stage 2; said input and output terminals being the same.

The terminal *b* connects the collector electrode of the transistor $T_3$ of the first amplifier stage 1 to the base electrode of a transistor $T_4$ of the second amplifier stage 2. The terminal *c* connects the emitter electrode of the transistor $T_3$ of the first amplifier stage 1 to a terminal 23 connected to a point at ground potential. The emitter electrode of the transistor $T_4$ is connected to the base electrode of a transistor $T_5$ in the second amplifier stage 2. An emitter resistor $R_3$ is connected between the emitter electrode of the transistor $T_4$ and ground. An emitter electrode $R_5$ is connected between the emitter electrode of the transistor $T_5$ and ground. The transistor $T_4$ of the second amplifier stage 2 operates in a collector circuit and the transistor $T_5$ of said second amplifier stage operates in an emitter circuit. The input signal to the multistage amplifier is supplied by a tank circuit 20 which is inductvely coupled to the base electrode of the transistor $T_3$ of the first amplifier stage 1 via an input terminal 21. The working point of the first amplifier stage 1 is regulated by the transistor $T_5$ of the second amplifier stage 2 via a feedback circuit which comprises a feedback resistor $R_4$. The feedback circuit connects the emitter electrode of the transistor $T_5$ to the base electrode of the transistor $T_3$ via the feedback resistor $R_4$, a terminal 22, a coupling winding 6 and the input terminal 21.

The collector voltage of the transistor $T_3$ and the collector currents of the transistors $T_4$ and $T_5$ may be maintained constant by the regulating feedback circuit. A tank circuit 30 is connected at one end to the collector electrode of the transistor $T_5$ of the second amplifier stage 2 via a terminal 25 and is connected at its other end to a terminal 26. The amplified output signal of the multistage amplifier is provided at the tank circuit 30.

The operational voltage of the additional stages is provided at the terminal 26. A terminal 24 is connected to the emitter electrode of the transistor $T_5$ of the second amplifier stage 2. A decoupling capacitor $C_1$ is connected between the terminal 22 in the feedback circuit and a point at ground potential. A decoupling capacitor $C_2$ is connected between the terminal 24 and a point at ground potential. A decoupling capacitor $C_3$ is connected between the terminal 26 and a point at ground potential.

In accordance with the present invention, the control circuit or stage 3 comprises a control transistor $T_2$ having an emitter-collector path connected in series circuit arrangement with the operating resistor $R_2$ of the transistor $T_3$ of the first amplifier stage 1. The transistor $T_2$ varies the operational voltage of the first amplifier stage 1. The collector electrode of the transistor $T_2$ is connected to the terminal 26 via which the operational voltage is applied.

The control voltage is applied to the base electrode of the transistor $T_2$ via an input terminal 28. A resistor $R_1$ is connected between the collector and base electrodes of the transistor $T_2$ and is therefore connected in parallel with the base-collector path of such transistor. The resistor $R_1$ provides a constant potential at the base electrode of the transistor $T_2$ in a manner whereby, in an uncontrolled condition in which the control voltage applied to the input terminal 28 is zero, said transistor functions essentially as a short-circuit.

The DC coupled multistage amplifier of the present invention, as shown in FIG. 2, functions in the following manner. It is assumed, in order to explain the regulation of the working or operation point via the feedback resistor $R_4$, that the current flowing through the transistor $T_5$ increases. This causes an increase in the emitter potential of the transistor $T_5$ and an increase in the base potential of the transistor $T_3$. As a result, the current flowing through the transistor $T_3$ increases and the voltage drop at the resistor $R_2$ increases. As hereinbefore described, in the uncontrolled condition, the transistor $T_2$ functions essentially as a short-circuit.

As a result of the increase in current through the transistor $T_3$, the collector potential of said transistor decreases and the base potential of the transistor $T_5$ decreases. This counteracts the increase in current in the transistor $T_5$. The potential resulting from the control process at the collector electrode of the transistor $T_3$ is constant, substantially independently of the collector current of said transistor. Thus, the collector current of the transistor $T_3$ may be varied in the actual control process, without markedly varying the collector currents of the succeeding amplifier stage transistors $T_4$ and $T_5$.

The multistage amplifier of the present invention has a reduction control. That is, the collector current of the transistor $T_3$ decreases upon an increase in the control voltage. If a negative control voltage is applied to the base electrode of the transistor $T_2$, the resistance of said transistor increases upon an increase in said control voltage, since said transistor becomes gradually more non-conductive. This decreases the collector current of the transistor $T_3$. Consequently, the amplification of the multistage amplifier decreases.

Figure 3:
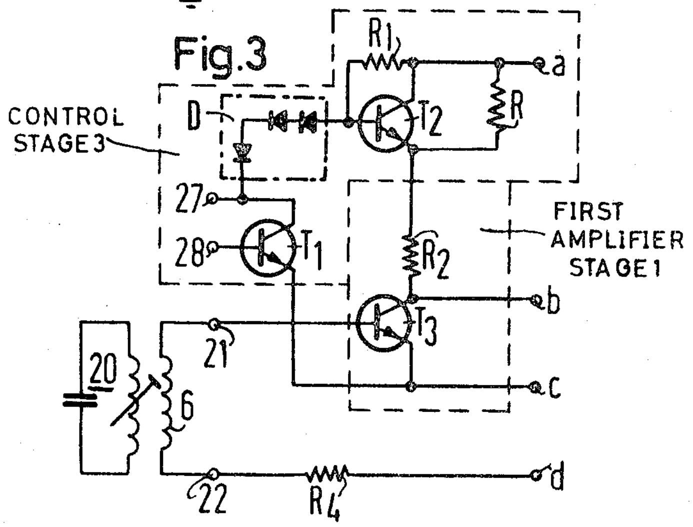
FIG. 3 is a circuit diagram of a modification of the embodiment of FIG. 2.

In a modification of the embodiment of FIG. 2, as shown in FIG. 3, an auxiliary control transistor $T_1$ is included in the control circuit 3. The auxiliary control amplifier $T_1$ is triggered by the control voltage, which is applied to the base electrode of said transistor via the input terminal 28. The collector or output electrode of the transistor $T_1$ is coupled to the base or input electrode of the transistor $T_2$. The transistor $T_2$, as hereinbefore described, controls the operational voltage of the first amplifier stage 1. In FIG. 1, the circuit connected to the right of the terminals, *a*, *b*, *c* and *d* is identical with that of FIG. 2, so that only the circuit to the left of said terminals is shown in FIG. 3.

The auxiliary control transistor $T_1$ functions as an auxiliary control amplifier. The collector electrode of the transistor $T_1$ is coupled to the base electrode of the transistor $T_2$ via a plurality of diodes D connected in series circuit arrangement between said collector electrode and said base electrode. A positive control voltage is applied to the base electrode of the transistor $T_1$. The base potential of the transistor $T_2$ is decreased by the diodes D. This also decreases the potential connected to ground at the emitter electrode of the transistor $T_2$. The potential connected to ground at the emitter electrode of the transistor $T_2$ is the operational voltage of the first amplifier stage 1.

The decrease of the voltage connected to ground at the emitter electrode of the transistor $T_2$ causes a decrease in the current flowing through the transistor $T_3$. The decrease in current flowing through the transistor $T_3$ results in a decrease in the amplification of the first amplifier stage 1. The diodes D produce a decrease in the collector potential of the transistor $T_1$ only to the extent that said collector potential cannot decrease below a predetermined value, although said transistor is in its non-conductive condition.

When the amplification is under control, the diodes D simultaneously provide at the collector or output electrode of the transistor $T_1$ a voltage having a predetermined final magnitude which is dependent upon the control condition of said transistor. When the multistage amplifier of the present invention is utilized, for example, as a controllable IF amplifier, the voltage provided at an output terminal 27, which is connected to the collector electrode of the transistor $T_1$, may be advantageously utilized to regulate the first amplifier stage 1 and the mixer of the receiver.

In an amplifier stage having reduction control, as indicated by the first amplifier stage 1 of FIG. 3, the undistorted signal provided at the output of said amplifier stage decreases in magnitude upon an increase in control. It may therefore be necessary to determine a minimum collector current for an amplifier stage having reduction control. This may be provided by the utilization of a current conducting resistor R.

In FIG. 3, the additional current conducting resistor R is connected between the emitter and collector electrodes of the transistor $T_2$ and is therefore connected in parallel with the emitter-collector path of said transistor. The resistor R determines a minimum amplification of the first amplifier stage 1 at full control. The inclusion of the resistor R in the circuit of FIG. 3 is optional, and is not necessary for the proper operation of said circuit. The DC coupled multistage amplifier of the present invention is preferably an integrated monolithic circuit.

While the invention has been described by means of specific examples and in specific embodiments, we do not wish to be limited thereto, for obvious modifications will occur to those skilled in the art without departing from the spirit and scope of the invention.

We claim:

1. A DC coupled multistage amplifier controllable in amplification and having a first amplifier stage having an input, an operational voltage branch and an output and additional amplifier stage means having an input connected to the output of said first amplifier stage and an output, said amplifier comprising feedback means coupling the output of said additional amplifier stage means to the input of said first amplifier stage for regulating the working point of said first amplifier stage under the control of said additional amplifier stage means, the amplification of said additional amplier stage means being substantially independent of the regulation of the working point of said first amplifier stage; and control means connected to the operational voltage branch of said first amplifier stage for applying a control voltage to said first amplifier stage to vary the operational voltage of said first amplifier stage, said control means comprising a control transistor connected in the operational voltage branch of said first amplifier stage, means for applying the control voltage to said transistor to trigger said transistor to vary the operational voltage of said first amplifier stage in accordance with said control voltage, an auxiliary control transistor having an input electrode and an output electrode coupled to the input electrode of said control transistor and means for applying the control voltage to said auxiliary control transistor to trigger said transistor.

2. A DC coupled multistage amplifier as claimed in claim 1, wherein said control means further comprises diode means coupling the output electrode of said auxiliary control transistor to the input electrode of said control transistor, said auxiliary control transistor providing at its output electrode a voltage having a predetermined final magnitude dependent upon the control condition of said transistor when the amplification of said first amplifier stage is under control.

3. A DC coupled multistage amplifier as claimed in claim 1, wherein said control means further comprises current means connected in parallel with said control transistor for determining a minimum amplification of said first amplifier stage at full control.

References Cited

UNITED STATES PATENTS

| | | | |
|---|---|---|---|
| 3,365,673 | 1/1968 | Barditch et al. ------ | 330—29X |
| 3,454,892 | 7/1969 | Knowles ------------ | 330—29 |

OTHER REFERENCES

Bertoya, "A Transistor Amplifier with D.C. and A.C. Feedback Stabilization," Electronic Engineering, April 1964, pp. 240–245.

ROY LAKE, Primary Examiner

J. B. MULLINS, Assistant Examiner

U.S. Cl. X.R.

330—18, 19, 25